United States Patent
Shi

(10) Patent No.: US 8,893,361 B2
(45) Date of Patent: Nov. 25, 2014

(54) METHOD OF BONDING COMPONENTS TO EACH OTHER USING EXOTHERMIC REACTIONS

(75) Inventor: Fong Shi, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 165 days.

(21) Appl. No.: 13/419,086

(22) Filed: Mar. 13, 2012

(65) Prior Publication Data
US 2013/0239407 A1 Sep. 19, 2013

(51) Int. Cl.
*B21D 33/00* (2006.01)
(52) U.S. Cl.
USPC ............ 29/17.2; 29/17.1; 29/17.3; 29/17.9; 228/198
(58) Field of Classification Search
CPC .. B23K 1/0006; B23K 1/0014; B23K 1/0016; B23K 11/20; B23K 20/02; B23K 20/023; B23K 35/30; B23K 35/3033
USPC ................. 29/17.1, 17.2, 17.3, 17.9; 228/198
See application file for complete search history.

(56) References Cited

U.S. PATENT DOCUMENTS

| | | | |
|---|---|---|---|
| 6,534,194 B2 * | 3/2003 | Weihs et al. ................. 428/635 |
| 6,736,942 B2 | 5/2004 | Weihs et al. |
| 7,644,854 B1 * | 1/2010 | Holmes et al. ............ 228/234.3 |
| 8,018,980 B2 | 9/2011 | Deri et al. |
| 8,444,045 B2 * | 5/2013 | Baker ........................ 228/233.1 |
| 2008/0063889 A1 | 3/2008 | Duckham et al. |
| 2009/0173626 A1 * | 7/2009 | Duckham et al. ........ 204/298.13 |
| 2010/0175756 A1 | 7/2010 | Weihs et al. |
| 2011/0031301 A1 * | 2/2011 | Segletes et al. ............... 228/198 |
| 2011/0079631 A1 * | 4/2011 | Baker ........................... 228/121 |
| 2012/0055979 A1 * | 3/2012 | Alghusain ..................... 228/198 |

* cited by examiner

*Primary Examiner* — Carl Arbes
(74) *Attorney, Agent, or Firm* — Yee & Associates, P.C.

(57) ABSTRACT

A method and apparatus for joining a first workpiece and a second workpiece. A layer of exothermic material is placed between the first workpiece and the second workpiece. A plurality of currents is applied to the layer of exothermic material in a plurality of locations and substantially at the same time such that an exothermic reaction occurs in the layer of exothermic material.

20 Claims, 7 Drawing Sheets

METHOD OF BONDING COMPONENTS TO EACH OTHER USING EXOTHERMIC REACTIONS

BACKGROUND INFORMATION

1. Field

The present disclosure relates generally to manufacturing and, in particular, to joining components to each other. Still more particularly, the present disclosure relates to a method and apparatus for bonding components to each other using solder and exothermic reactions.

2. Background

Many devices include electronic circuits. These electronic circuits may take the form of integrated circuits. These integrated circuits may also be referred to as chips. Typically, an integrated circuit is placed in a package. The package may comprise two parts. The integrated circuit may be mounted on one part, such as a substrate. The other part, a cover, may be bonded to the substrate to form the package with the integrated circuit located inside of the package. The package provides protection and electrical connections for the integrated circuit. The package may then be mounted on a substrate, such as a printed circuit board. The printed circuit board provides mechanical support and an electrical connection between different electronic components.

In other cases, an integrated circuit may be mounted or formed on the printed circuit board. A cover may be placed over the integrated circuit and bonded to the printed circuit board. The cover may be bonded to the circuit board to cover the integrated circuit in a manner such that a hermetic seal is formed.

An example of an integrated circuit with supporting components on which a hermetic seal may be desired is a phased array antenna module. This type of circuit, as well as other types of electronic circuits, may be sealed to reduce moisture from entering and affecting the operation of these circuits. Currently, the circuits are often hermetically sealed in ceramic packages, glass or metal packages, or other types of packages. In some cases, covers may be placed directly on a printed circuit board substrate. These types of packages typically use solder to form a seal against moisture intrusions.

Soldering, resistance welding, or some other suitable technique is typically used to bond the cover to the substrate. The heat generated in bonding the cover to the substrate involves temperatures over periods of time that may be higher than desired. These temperatures may produce undesired effects on the integrated circuit and other co-located components. For example, high temperatures may cause undesired effects, such as damaging the bonding material that attaches an integrated circuit to a substrate, destroying the components that are co-located with the integrated circuit within the same package, inducing stress on the integrated circuit and surrounding components, reducing the life of the integrated circuit and its supporting components, or some combination thereof.

As a result, with currently used methods for sealing components, rework or replacement of damaged integrated circuits and other components may occur more often than desired. Accordingly, the time and expense needed to manufacture circuits and circuit systems may be greater than desired.

Therefore, it would desirable to have a method and apparatus that takes into account at least some of the issues discussed above as well as possibly other issues.

SUMMARY

In one illustrative embodiment, a method for joining a first workpiece and a second workpiece to each other is provided. A layer of exothermic material is placed between the first workpiece and the second workpiece. A plurality of currents is applied to the layer of exothermic material in a plurality of locations and at substantially the same time such that an exothermic reaction occurs in the layer of exothermic material.

In another illustrative embodiment, a method for sealing a circuit on a printed circuit board is provided. A layer of exothermic material is placed between a cover and the printed circuit board. The cover is located over an integrated circuit on the printed circuit board. A plurality of current pulses is applied to the layer of exothermic material in a plurality of locations. The plurality of current pulses is applied at substantially the same time such that an exothermic reaction occurs in the layer of exothermic material. A force is applied that pushes the cover toward the printed circuit board while the exothermic reaction occurs forming a hermetic seal between the cover and the printed circuit board.

In yet another illustrative embodiment, an apparatus comprises a platform and a controller. The platform is configured to hold a first workpiece and a second workpiece with a layer of exothermic material located between the first workpiece and the second workpiece. The controller is configured to apply a plurality of currents to the layer of exothermic material in a plurality of locations. The plurality of currents is applied at substantially the same time such that an exothermic reaction occurs in the layer of exothermic material.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof will best be understood by reference to the following detailed description of an illustrative embodiment of the present disclosure when read in conjunction with the accompanying drawings, wherein:

DETAILED DESCRIPTION

The illustrative embodiments recognize and take into account a number of different considerations. For example, the illustrative embodiments recognize and take into account that selecting an exothermic material for the solder may reduce the time and temperature used to bond components to each other.

The illustrative embodiments also recognize and take into account that applying a current to solder may not provide a desired level of consistency in the solder after the exothermic reaction has occurred. For example, when the solder has a shape configured to fit narrow areas in packages for integrated circuits, the solder may not flow in a desired manner.

In other words, gaps or edges to be sealed using solder or other materials on an electronic package are usually narrow and limited. Molten solder tends to follow a least resistive path. As a result, the flow of solder along a peripheral of the package becomes unpredictable. Because the direction, uniformity, and consistency of the solder in a molten state are not under control, a wide variation from part to part in production may occur. Manufacturing packages with seals that are void-free, crack-free, and creep-resistant may be more difficult to obtain than desired. The illustrative embodiments recognize and take into account that the direction of flow of the solder, the uniformity of the solder, and the consistency of the solder may result in inconsistencies such that a hermetic seal using solder may not be present when components in a package for an integrated circuit are bonded together by an exothermic process.

Thus, one or more illustrative embodiments provide a method and apparatus for joining a first workpiece and a second workpiece to each other. A layer of exothermic material is placed between the first workpiece and the second workpiece. A plurality of currents is applied to the layer of exothermic material in a plurality of locations. The plurality of currents is applied at substantially the same time such that an exothermic reaction occurs in the layer of exothermic material.

The plurality of currents may be selected such that the flow of solder is more uniform and consistent. As a result, inconsistencies in the solder after cooling may be reduced such that a hermetic seal is present.

Figure 1:
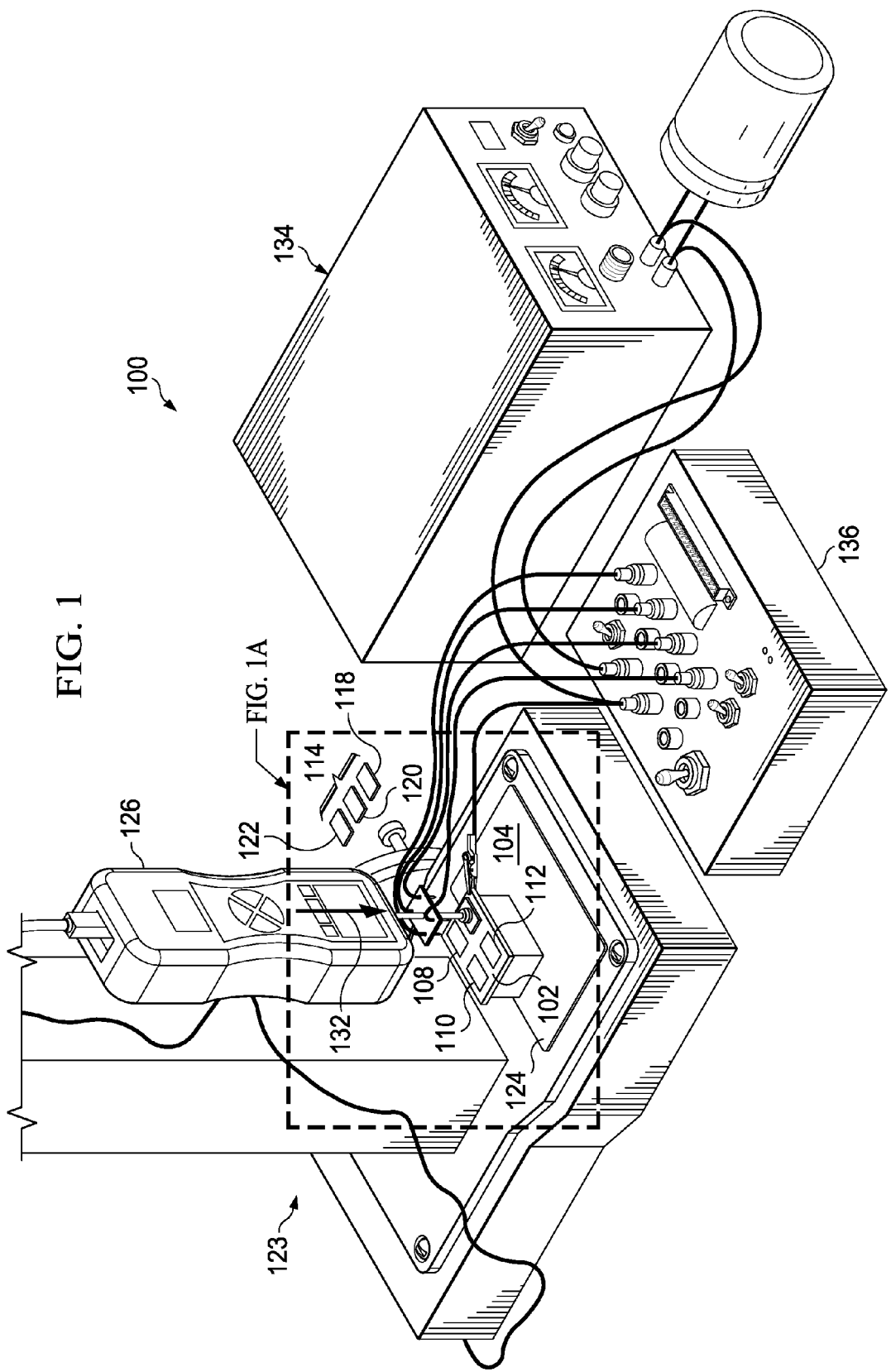
FIGS. 1, 1A, and 1B are illustrations of a manufacturing environment in accordance with an illustrative embodiment.
Figure 1A:
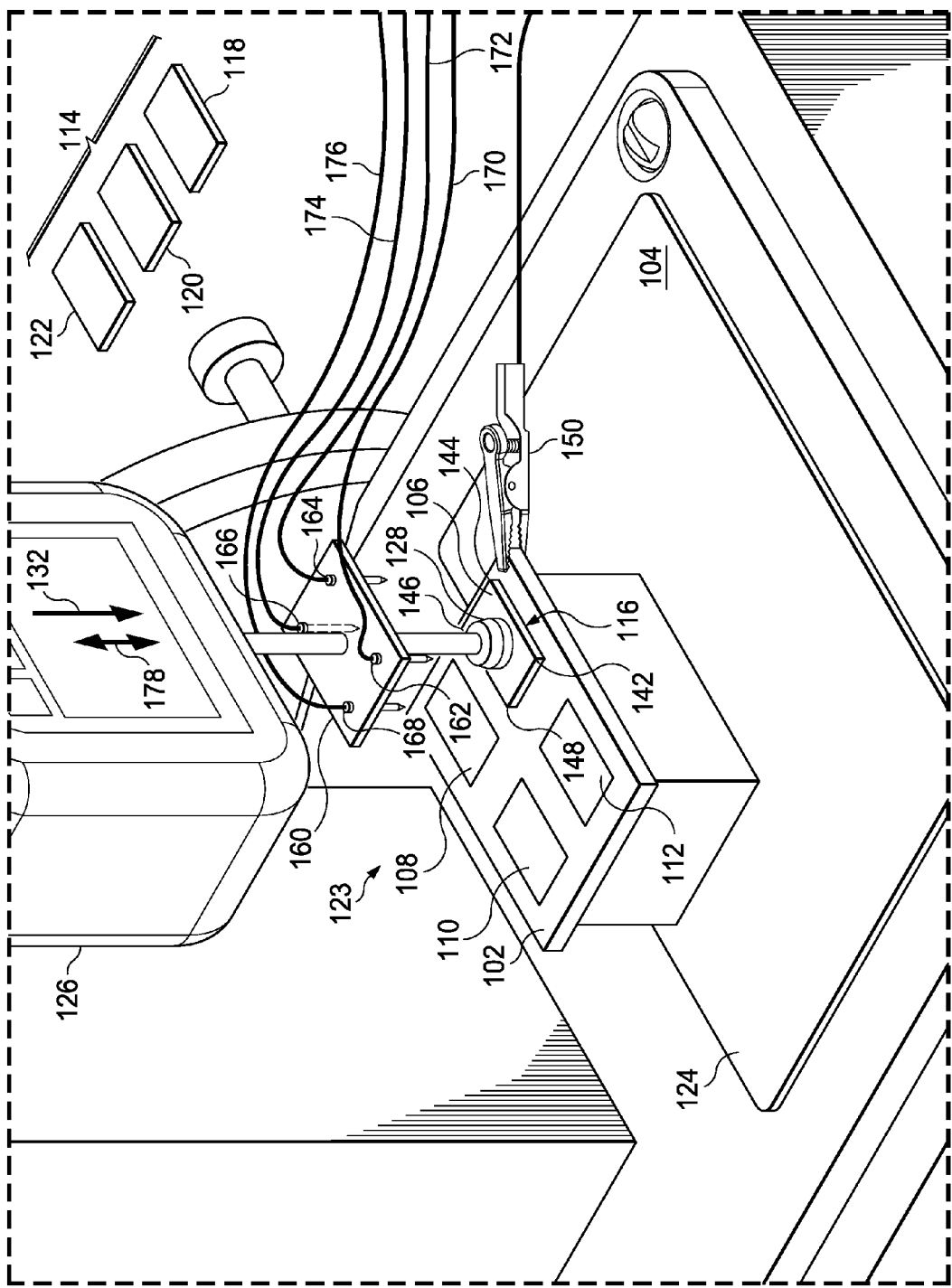

With reference now to the figures and, in particular, with reference to FIGS. 1 and 1A, illustrations of a manufacturing environment is depicted in accordance with an illustrative embodiment. In these illustrative examples, manufacturing environment 100 includes substrate 102. Substrate 102 is a substrate on which integrated circuits 104 comprising integrated circuit 106, integrated circuit 108, integrated circuit 110, and integrated circuit 112 are shown. In particular, substrate 102 is a metal-plated substrate. For example, substrate 102 may be a printed circuit board.

In this illustrative example, integrated circuits 104 may be covered by covers 114. As depicted, covers 114 include cover 116, cover 118, cover 120, and cover 122. In these illustrative examples, covers 114 are metal plated. For example, cover 114 may be comprised of ceramic, plastic, or some other material with a metal coating. Cover 114 may be joined to substrate 102 using bonding system 123. In particular, cover 116 and substrate 102 are bonded to each other in these illustrative examples. As depicted, the bond is a molecular bond. When cover 116 and substrate 102 are bonded to each other, a joint is formed between these components.

As depicted, cover 116 has been placed over integrated circuit 106. In this illustrative example, cover 116 is positioned to be bonded to substrate 102. As depicted, cover 116 is a first workpiece, and substrate 102 is a second workpiece.

Substrate 102 with cover 116 over integrated circuit 106 is located on platform 124 of bonding system 123. Bonding system 123 includes load unit 126. Load unit 126 has tip 128 engaged with the top of cover 116.

In this illustrative example, load unit 126 is configured to exert force in the direction of arrow 132. Force in the direction of arrow 132 pushes these two workpieces, cover 116 and substrate 102, toward each other. More specifically, cover 116 is pushed toward substrate 102.

In this illustrative example, cover 116 is bonded to substrate 102 using a plurality of currents generated by bonding system 123. In these illustrative examples, the plurality of currents is a plurality of current pulses. In other words, each current has a fixed duration. In these illustrative examples, each current has the same amplitude and duration. This duration may be referred to as a pulse width.

The plurality of currents is sent through a number of layers of solder. As used herein, a "number of", when used with reference to items, means one or more items. For example, a number of layers of solder is one or more layers of solder. The number of layers of solder is located between cover 116 and substrate 102.

In these illustrative examples, solder is comprised of a number of exothermic materials. In other words, the material selected for solder is one or more materials that release energy in the form of heat in response to the plurality of currents generated by bonding system 123.

As depicted, bonding system 123 includes energy source 134 and current controller 136. Energy source 134 is configured to generate a current. In these illustrative examples, energy source 134 may be a generator, an outlet, a power supply, or some other suitable source for current.

Current controller 136 is configured to receive the current from energy source 134 and generate a plurality of currents. Further, energy source 134 and current controller 136 also are configured to generate the plurality of currents with a desired current level. In these illustrative examples, the current level is selected such that an exothermic reaction occurs in the number of layers of solder.

The amplitude of the current pulse is selected based on the shape of the package cover, the type of the exothermic material, the type of the solder material, and the total surface contact area to be bonded. In these illustrative examples, all of the currents have the same amplitude.

The timing and duration of the currents also are controlled by current controller 136 in bonding system 123 in these illustrative examples. The timing of the plurality of currents is selected such that the plurality of currents is applied to the number of layers of solder at substantially the same time. In these illustrative examples, a simultaneous or substantially simultaneous application of the plurality of currents to the number of layers of exothermic and solder materials may provide a desired level of uniformity in the melting and flow of the number of layers of solder. The width of the current pulse is determined by an initiation time it requires to start an exothermic reaction for given exothermic and solder materials. Once activation is initiated, the pulse duration ends and the exothermic process is self sustained until the exothermic material is consumed.

In this illustrative example, the plurality of currents is sent through the number of layers of solder at locations, such as location 142, location 144, location 146, and location 148. As can be seen in these illustrative examples, these locations are at the corners of cover 116. In these examples, location 142, location 144, location 146, and location 148 are selected to provide a desired level of uniformity in heating the number of layers of solder when an exothermic reaction occurs in the number of layers of solder. Of course, other locations and other numbers of locations other than these may be used, depending on the particular implementation.

In these illustrative examples, current is applied to these areas through probe system 160. Probe system 160 includes probes 162, 164, 166, and 168 that are connected to current controller 136 via wires 170, 172, 174, and 176.

Figure 1B:
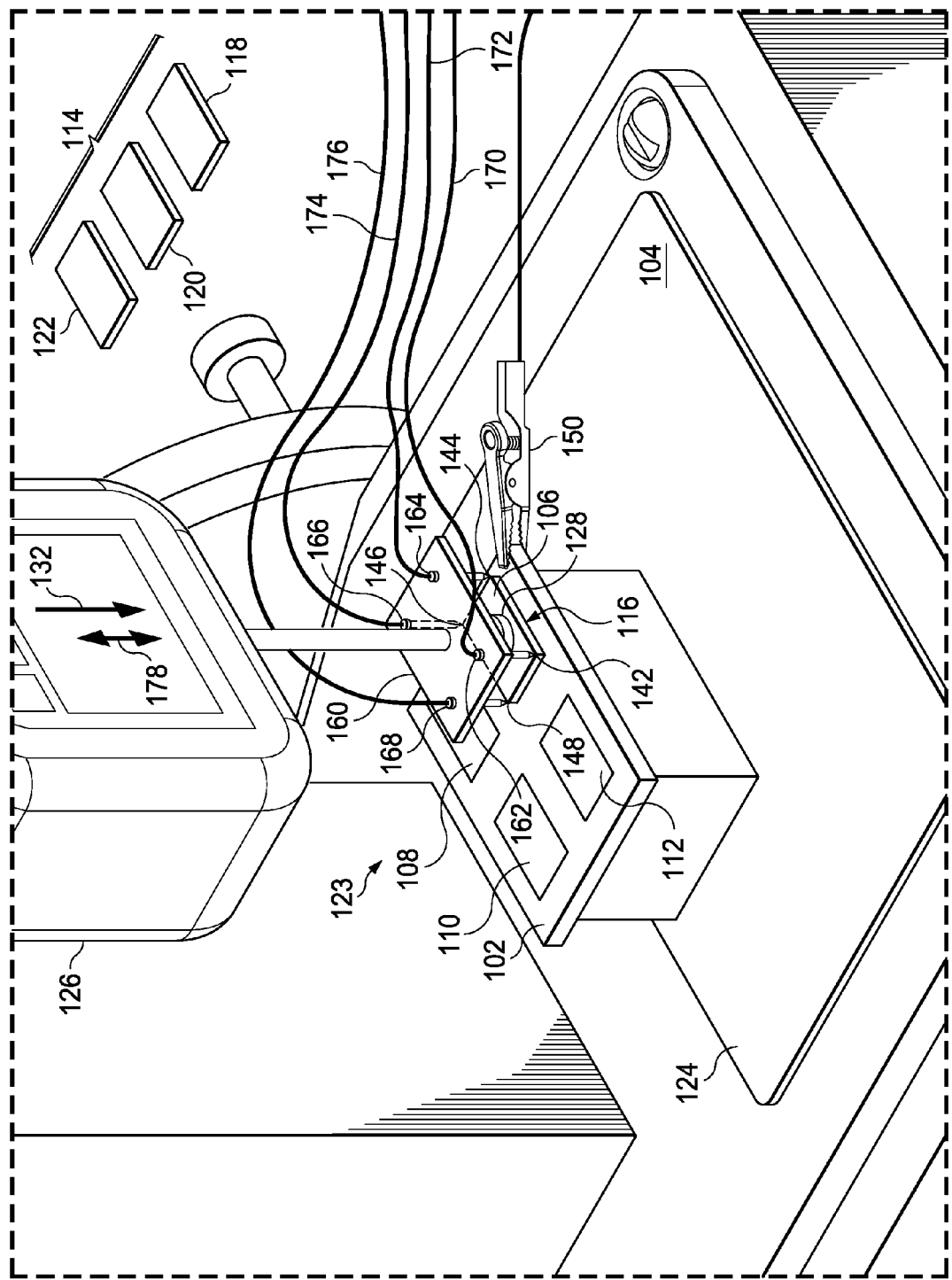

In this illustrative example, as depicted in FIG. 1A, probe system 160 is moveable in the direction of arrow 178. As illustrated, probe system 160 is moveably mounted to elongate member 180 of load unit 126. Movement of probe system 160 towards locations 142, 144, 146, and 148 results in contact of probes 162, 164, 166, and 168 with locations 142, 144, 146, and 148 as shown in FIG. 1B.

Additionally, location 150 also is on substrate 102. Location 150 is a location for a ground connection. Current flowing into location 142, location 144, location 146, and location 148 flow to location 150.

In these illustrative examples, by using the plurality of currents at location 142, location 144, location 146, and location 148, the exothermic reaction melts the number of layers of solder in a manner that bonds the first workpiece, cover 116, to the second workpiece, substrate 102. Further, the exothermic reaction also may result in a hermetic seal for integrated circuit 106 covered by cover 116 on substrate 102. In these illustrative examples, a hermetic seal is an air-tight seal.

The process illustrated in FIG. 1 may be performed using less heat as compared to currently available systems for soldering components to each other. The soldering performed using bonding system 123 may be performed at room temperature. In these examples, room temperature is a temperature at which a human operator may perform operations.

In addition, bonding system 123 results in heating of components that may be for shorter periods of time as compared to currently used soldering systems. For example, the exothermic reactions in the number of layers of solder may only last for a fraction of a second. In this manner, undesired results from temperatures at longer periods of time may be reduced or avoided. In particular, damage to integrated circuit 106, a reduction in the life of integrated circuit 106, supporting components for integrated circuit 106, and other undesirable effects may be reduced or avoided.

Further, bonding system 123 also may be applied to other types of bonding for components. For example, bonding system 123 also may be applied to brazing components to join the components to each other. In these illustrative examples, the bonding process with the exothermic reaction in manufacturing environment 100 may be performed in a vacuum filled with inert gas. Causing a vacuum to be present and then introducing an inert gas into manufacturing environment 100 helps reduce contaminants in manufacturing environment 100. The vacuum, inert gas, or combination of the two may reduce the occurrence of corrosion or other undesired effects.

A vacuum may be used to withdraw unwanted chemical fumes and impurities from being captured inside the sealed package. Inert gases may be selected as gases that do not react with the integrated circuits and supporting components. The inert gases may be used to displace and/or flush undesirable moisture and substances out of the packages before sealing takes place.

Figure 2:
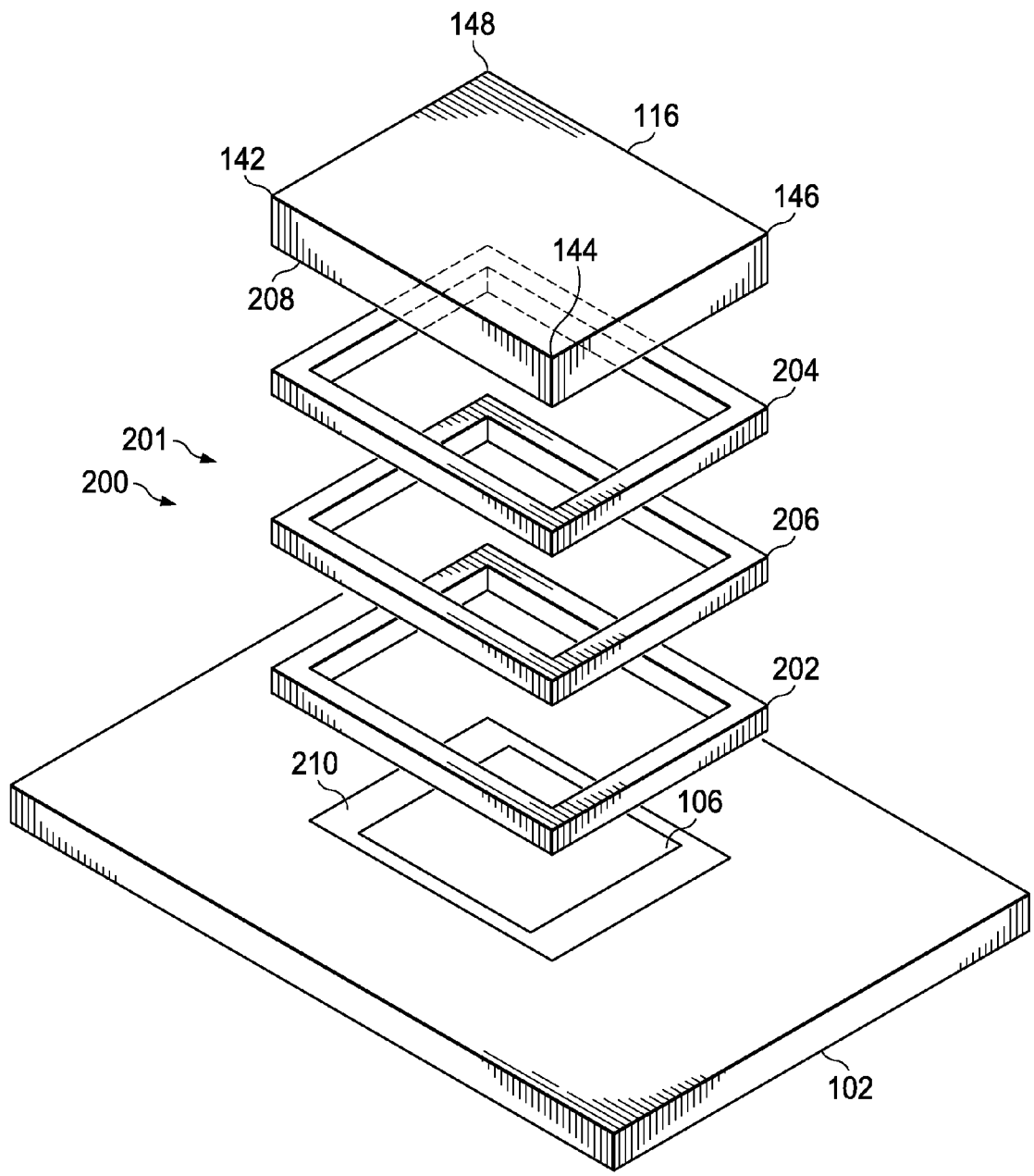
FIG. 2 is an illustration of workpieces in accordance with an illustrative embodiment.

With reference now to FIG. 2, an illustration of workpieces is depicted in accordance with an illustrative embodiment. In this illustrative example, an exploded view of cover 116, substrate 102, and with solder 201 in the form of a number of layers is shown in this figure.

In this illustrative example, the number of layers of solder 201 takes the form of frames 200 of solder 201. In this illustrative example, frames 200 of solder 201 include first frame 202 and second frame 204. First frame 202 and second frame 204 are comprised of solder 201 in these depicted examples. In this illustrative example, solder 201 in frames 200 is comprised of aluminum and nickel. For example, second frame 204 and frame 206 may each be comprised of a plurality of layers of a first metal interleaved with a plurality of layers of a second metal. For example, a plurality of layers of aluminum may be interleaved with a plurality of layers of nickel. In other examples, placement of exothermic frames and solder frames can be interchangeable. In some cases, second frame 204 or first frame 202 may be omitted.

In still other illustrative examples, these frames may be comprised of a plurality of layers of a first exothermic material interleaved with a second plurality of layers of a second exothermic material that can be activated exothermically by a plurality of current pulses.

In these illustrative examples, frames 200 of solder 201 are rectangular in shape. The shape of these frames, however, may vary, depending on the configuration of the surfaces to be bonded together on cover 116, frame 206, and substrate 102.

For example, these frames may have other shapes, such as a circular shape, a square shape, a triangular shape, a hexagonal shape, and other suitable shapes. In other illustrative examples, these frames may have multiple openings instead of one opening. In yet other illustrative examples, the number of layers of solder 201 may be layers without openings.

In these illustrative examples, cover 116 is indirectly bonded to substrate 102 by frame 206. Frame 206 is a metal frame and is located between cover 116 and substrate 102. In these illustrative examples, frame 206 is bonded to cover 116 and to substrate 102 to bond cover 116 to substrate 102. Of course, in some illustrative examples, frame 206 may be omitted, and cover 116 and substrate 102 may be directly bonded to each other.

As depicted, frame 206 is located between first frame 202 and second frame 204. Frame 206 may be comprised of gold or some other material that may help facilitate bonding cover 116 to substrate 102 when first frame 202 and second frame 204 in the number of layers of solder 201 melt during an exothermic reaction. The melting of first frame 202 and second frame 204 of solder 201 causes frame 206 to be bonded to cover 116 and substrate 102.

Further, bottom 208 of cover 116 also may be plated or covered with gold or some other solderable material that increases the ability of solder 201 to bond cover 116 to frame 206. As another example, at least a portion of surface 210 on substrate 102 corresponding to where frame 206 is to be connected to substrate 102 may be coated or otherwise covered with gold or some other suitable material.

As illustrated, location 142, location 144, location 146, and location 148 are on the corners of cover 116 in this illustrative example. Current applied to these locations flows through cover 116 to second frame 204 and to first frame 202 to cause an exothermic reaction in solder 201 in these frames. Of course, these locations may be located elsewhere, depending on the particular implementation.

In these illustrative examples, when a plurality of currents is applied to cover 116 at location 142, location 144, location 146, and location 148, these currents flow through second frame 204 and first frame 202. The plurality of currents are selected such that solder 201 in first frame 202, and second frame 204 have an exothermic reaction that generates heat that melts the solder. These locations and the number of currents used in the plurality of currents are selected such that the exothermic reaction of solder 201 has a desired level of uniformity and/or consistency.

In the illustrative examples, activation of the exothermic reaction is controlled in a manner that provides a desired level of uniformity and/or consistency in solder 201. In the illustrative examples, the current has a fixed magnitude and duration. The magnitude and pulse width is maintained such that these parameters do not substantially vary during the activation process, regardless of the internal resistance of energy source 134 in FIG. 1, wire resistance, and contact resistance at locations 142, 144, 146, and 148.

After solder 201 is activated through the exothermic reaction, solder 201 in molten form flows from the points of contact along a least resistive path. Passage of solder 201 flowing along the package interface to be bonded becomes more predictable. In other words, direction, uniformity, and consistency of the solder in molten state are under control. As a result, less variation may be present from part to part. Further, increased repeatability of an acceptable void-free and creep-resistant bond may be obtained in volume production.

When a desired level of uniformity and/or consistency is present in the flow of solder 201; voids, cracks, and other inconsistencies may be reduced in solder 201 as solder 201 cools. As a result, a hermetic seal may form when cover 116 is bonded to substrate 102. This hermetic seal may reduce or prevent moisture from entering the interior of cover 116 where integrated circuit 106 and other supporting components are located.

Figure 3:
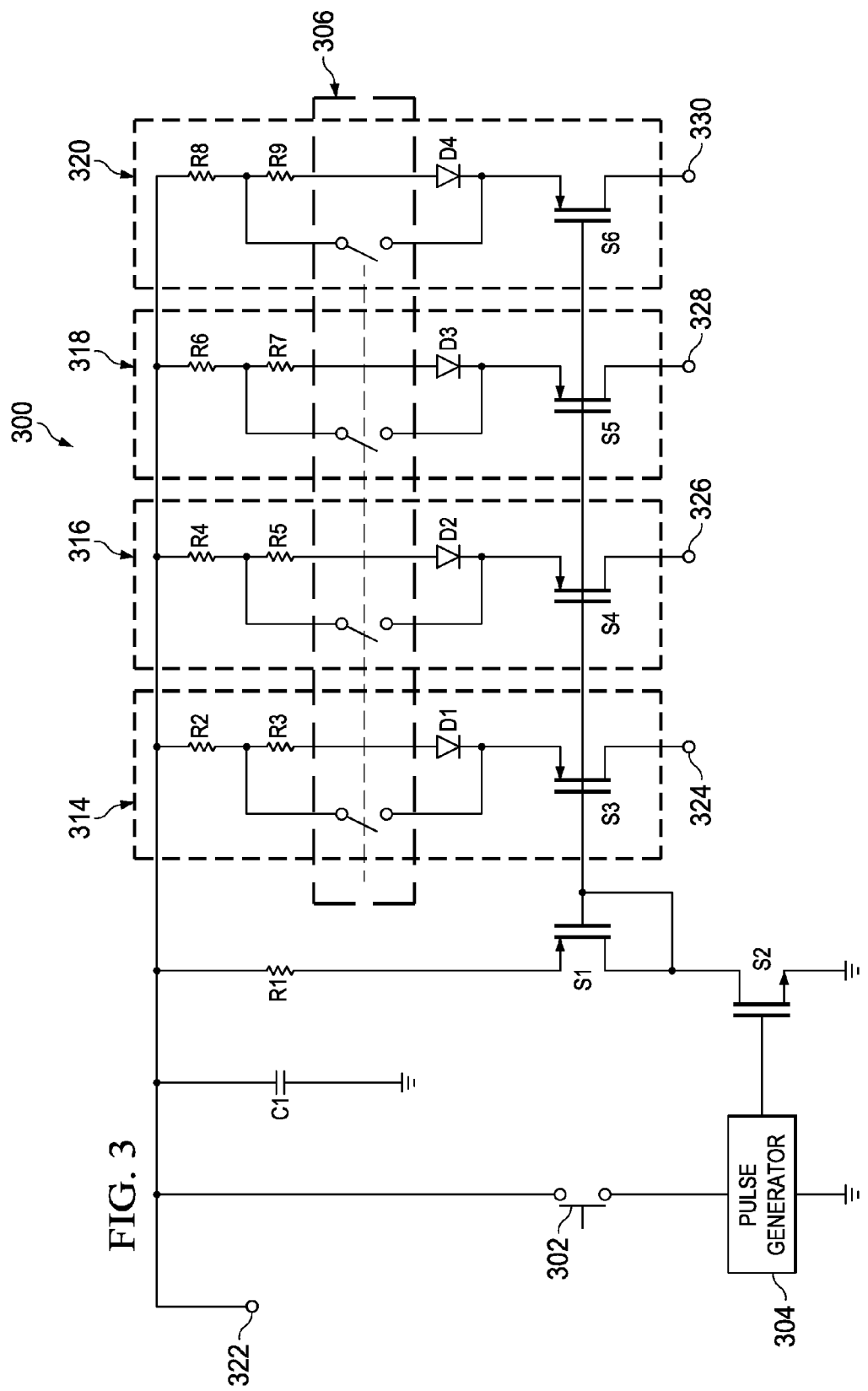
FIG. 3 is an illustration of a circuit for initiating an exothermic reaction in accordance with an illustrative embodiment.

With reference to FIG. 3, an illustration of a circuit for initiating an exothermic reaction is depicted in accordance with an illustrative embodiment. In this illustrative example, circuit 300 is a circuit that may be implemented in current controller 136 in FIG. 1. Circuit 300 may be used to control when currents are applied to solder in FIG. 1 and the duration of these currents.

As depicted, circuit 300 includes switch 302, pulse generator 304, capacitor C1, resistor R1, transistor S1, transistor S2, switch 306, channel 314, channel 316, channel 318, and channel 320. Circuit 300 also includes current input connector 322, current output connector 324, current output connector 326, current output connector 328, and current output connector 330.

As depicted, current input connector 322 is configured to be connected to an energy source, such as energy source 134 in FIG. 1. Current output connectors 324, 326, 328, and 330 are configured to be connected to a stack of workpieces. In particular, current output connectors 324, 326, 328, and 330 may be connected to location 142, location 144, location 146, and location 148 in FIG. 1.

Capacitor C1 is connected to current input connector 322 and may be charged by current received by current input connector 322. In these illustrative examples, the current received at current input connector 322 is a direct current. In one illustrative example, capacitor C1 has a capacity of about 1,000 microfarads.

Channel 314 includes resistor R2, resistor R3, light emitting diode D1, and switch S3. Channel 316 includes resistor R4, resistor R5, light emitting diode D2, and switch S4. Channel 318 includes resistor R6, resistor R7, light emitting diode D3, and switch S5. Channel 320 includes resistor R8, resistor R9, light emitting diode D4, and switch S6.

In these illustrative examples, switches S1, S2, S3, S4, S5, and S6 are semiconductor switches. In particular, these switches may be metal oxide semiconductor field effect transistors (MOSFETs). In these illustrative examples, all of the different switches are as close to identical as possible. For example, the device parameters, sizes, and other features of these switches are selected to be substantially the same.

In these illustrative examples, current may be discharged from capacitor C1 when switch 302 is pushed. Switch 302 is a push button switch in these illustrative examples. In other words, when switch 302 is pushed by an operator, switch 302 closes and then opens.

When switch 302 is pushed, pulse generator 304 is configured to cause a plurality of currents to flow through channels 314, 316, 318, and 320 for a selected period of time. The duration of the selected period of time forms a pulse for the plurality of currents flowing through channels 314, 316, 318, and 320. In this manner, a plurality of current pulses is generated through these channels. In these illustrative examples, four current pulses are generated that have substantially the same amplitude and duration. In these illustrative examples, the pulse is selected to have an amplitude and duration that are sufficient to have an exothermic reaction to occur within an exothermic material, which is to melt the solder, in the stack of workpieces.

In these illustrative examples, switch S1, switch S2, and resistor R1 are configured to set up a bias current for channels 314, 316, 318, and 320 at the same time when activated by pulse generator 304. These channels are activated at substantially the same time by controlling switches S3, S4, S5, and S6. When switches S3, S4, S5, and S6 are closed, current flows through channels 314, 316, 318, and 320 to current output connectors 324, 326, 328, and 330, respectively.

The resistors in each channel are configured to generate a current having an amplitude that is defined with respect to resistor R1. For example, in channel 314, a ratio of resistor R1 to the sum of resistor R2 and resistor R3 defines an amplitude of the current flowing through channel 314. In these illustrative examples, all of these resistors have substantially the same values such that the current flowing through the channels has substantially the same amplitudes for a majority of cases where parts to be bonded are of regular and symmetrical shapes. However, for some parts of odd shapes and irregular configurations, values of the resistors in each channel can be customized. Therefore, each current amplitude may be selected to optimize the activation of the exothermic process. In other words, the pulses may have different amplitudes and durations, depending on the configuration of the workpieces.

In these illustrative examples, the connections of current output connectors 324, 326, 328, and 330 to locations in a stack of workpieces may be tested using circuit 300. For example, switch 306 may be operated to test channels 314, 316, 318, and 320 to determine whether an electrical connection is present between current output connectors 324, 326, 328, 330, and locations on the stack of workpieces that are to be bonded to each other. In these illustrative examples, switch 306 is a single pole quad through (SPQT) switch.

When switch 306 is in an open position, testing of channels 314, 316, 318, and 320 may be performed to verify electric connectivity is present prior to activation. The testing occurs when switch 302 is pushed. With switch 306 in an open position, current flows through light emitting diodes D1, D2, D3, and D4, respectively. The current flowing through these light emitting diodes has a low enough amplitude that an exothermic reaction is not caused in the solder or other exothermic material in the stack of workpieces. Light emitting diodes that become illuminated in light emitting diodes D1, D2, D3, and D4 indicate that the channel corresponding to the light emitting diode has an electrical connection to the stack of workpieces.

After light emitting diodes D1, D2, D3, and D4 illuminate to indicate electrical connections are obtained; switch 306 may be placed in a closed position. Resistors R3, R5, R7, R9, and light emitting diodes D1, D2, D3, and D4 are shunted by the closed switch 306, and circuit 300 is ready for activation. When switch 302 is pushed, predetermined current pulses with substantially higher amplitudes in channels 314, 316, 318, and 320 are generated to activate the exothermic process.

Figure 4:
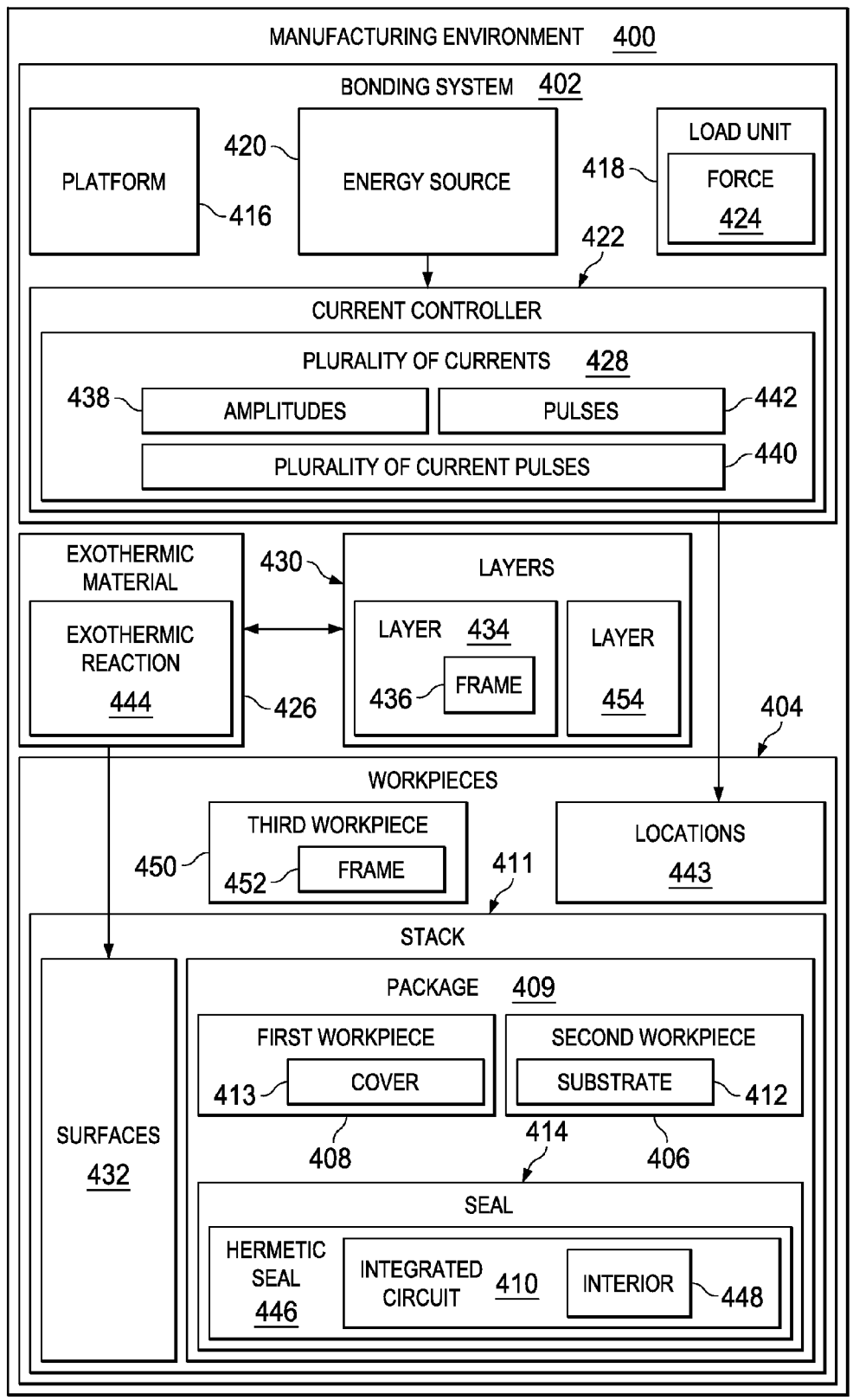
FIG. 4 is an illustration of a block diagram of a manufacturing environment in accordance with an illustrative embodiment.

Turning now to FIG. 4, an illustration of a block diagram of a manufacturing environment is depicted in accordance with an illustrative embodiment. In this illustrative example, manufacturing environment 400 is an example of one implementation for manufacturing environment 100 in FIG. 1.

As depicted, bonding system 402 is configured to bond workpieces 404 to each other. In this illustrative example, workpieces 404 comprise first workpiece 408 and second workpiece 406. Workpieces 404 may be components for package 409 in which integrated circuit 410 is located. When workpieces 404 are positioned relative to each other for bonding, stack 411 is formed.

In particular, first workpiece 408 may be cover 413, and second workpiece 406 may be substrate 412. Integrated circuit 410 is mounted on substrate 412. Cover 413 is configured to be bonded to substrate 412 and to cover integrated circuit 410.

When these workpieces are bonded to each other, the workpieces form package 409. In these illustrative examples, it may be desirable to have seal 414 for package 409. In these illustrative examples, seal 414 is a hermetic seal. Of course, other types of seals may be generated. In one illustrative example, seal 414 may be substantially air tight, water resistant, moisture resistant, or some other suitable type of seal.

In these illustrative examples, bonding system 402 comprises platform 416, load unit 418, energy source 420, and current controller 422. Platform 416 is configured to hold workpieces 404 while they are bonded to each other. Load unit 418 is configured to apply force 424 to workpieces 404. Force 424 is applied such that workpieces 404 are held together under a load.

Exothermic material 426 is placed between workpieces 404. In this illustrative example, exothermic material 426 may be considered part of stack 411. Exothermic material 426 may be comprised of one or more materials. In these illustrative examples, exothermic material 426 is selected as one that generates heat when plurality of currents 428 from current controller 422 is applied to exothermic material 426.

The material selected may be, for example, without limitation, at least one of aluminum, nickel, silver, bismuth, indium, zinc, copper, tin, lead, or other suitable materials. As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C, or item B and item C.

In these illustrative examples, exothermic material 426 is located in layers 430. Layers 430 may have different shapes, depending on the particular implementation. The configuration of a layer in layers 430 is such that exothermic material 426 contacts surfaces 432 in workpieces 404 that are to be bonded together. For example, layer 434 in layers 430 may be frame 436. Frame 436 may have different shapes. The shapes may include, for example, without limitation, a rectangle, a square, a circle, a hexagon, a pentagon, and other suitable shapes.

Energy source 420 is connected to current controller 422. Energy source 420 is configured to supply a current to current controller 422. Current controller 422 is configured to generate plurality of currents 428 with amplitudes 438. In these illustrative examples, amplitudes 438 are the same for all of the currents in plurality of currents 428. Amplitudes of the current pulses may be the same or different, depending on the particular implementation. Selection of the amplitude depends on a combination of the exothermic materials used, the shapes and the geometry of the parts to be bonded, and the total area of the package to be contacted.

Current controller 422 is configured to control the application of the current to the number of layers 430 of exothermic material 426 used with workpieces 404 as desired in the form of plurality of current pulses 440. For example, current controller 422 may control when plurality of currents 428 is applied to the number of layers 430 of exothermic material 426.

Additionally, current controller 422 may control plurality of currents 428 to form plurality of current pulses 440. In other words, plurality of currents 428 may be applied to layers 430 of exothermic material 426 in pulses 442. In these illustrative examples, pulses 442 are the same for all of plurality of currents 428. In other words, the amplitude and duration for pulses 442 are the same in these examples. Of course, in other illustrative examples, the amplitude and duration may be different for different pulses in pulses 442, depending on the particular implementation.

Current controller 422 is connected to at least one of workpieces 404 and layers 430 of exothermic material 426. The connection is an electrical connection made using wires in these illustrative examples.

In these illustrative examples, plurality of currents 428 are applied to layers 430 of exothermic material 426 through locations 443 in stack 411. Further, plurality of currents 428 are applied to layers 430 of exothermic material 426, while force 424 is applied to stack 411. More specifically, force 424 may be applied to workpieces 404.

Locations 443 in stack 411 may be located on at least one of workpieces 404, one of layers 430 of exothermic material 426, and in other locations. Locations 443 may be selected as any locations where plurality of currents 428 will flow through layers 430 of exothermic material 426 in a manner that causes exothermic reaction 444. For example, one location may be platform 416 if platform 416 is electrically connected to stack 411.

These locations are selected based on the predicted flow of exothermic material 426 from exothermic reactions initiated at these locations. These locations may be identified through empirical data obtained from tests, simulations, or other suitable sources.

Exothermic reaction 444 generates heat that melts exothermic material 426 in a manner that bonds first workpiece 408 to second workpiece 406. In these illustrative examples, exothermic material 426 may form hermetic seal 446 between first workpiece 408 and second workpiece 406. When second workpiece 406 is substrate 412 and first workpiece 408 is cover 413, these two workpieces are bonded to each other to form package 409. When bonded using bonding system 402, hermetic seal 446 is created such that integrated circuit 410 within interior 448 of package 409 is protected from moisture that may be in the environment around package 409.

Of course, in some illustrative embodiments, additional workpieces may be present in addition to substrate 412 and cover 413. For example, third workpiece 450 in the form of frame 452 may be present. Frame 452 may have the same shape as frame 436 of exothermic material 426. Frame 452 may be located between cover 413 and substrate 412. In particular, layer 454 of exothermic material 426 may be located between cover 413 and frame 452. Layer 434 of exothermic material 426 may be located between frame 452 and substrate 412.

In this manner, the amount of time and heat used to bond workpieces 404 to each other may be reduced. By reducing the amount of heat and the amount of time that workpieces 404 are exposed to heat, undesired effects on components, such as integrated circuit 410, may be reduced.

The different components shown in FIGS. 1-3 may be combined with components in FIG. 4, used with components in FIG. 4, or a combination of the two. Additionally, some of the components in FIGS. 1-3 may be illustrative examples of how components shown in block form in FIG. 4 can be implemented as physical structures.

The illustration of manufacturing environment 400 in FIG. 4 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, workpieces 404 may be workpieces for other structures other than package 409. For example, when second workpiece 406 is substrate 412, substrate 412 may be a printed circuit board on which integrated circuit 410 is located. First workpiece 408 in the form of cover 413 covers integrated circuit 410 on the printed circuit board. Bonding system 402 may be used to bond cover 413 to the printed circuit board in these illustrative examples.

In yet another illustrative example, bonding system 402 may be automated or computer controlled. For example, bonding system 402 may include a controller and mechanisms to move and place workpieces 404 on platform 416 with a number of layers 430 of exothermic material 426.

Figure 5:
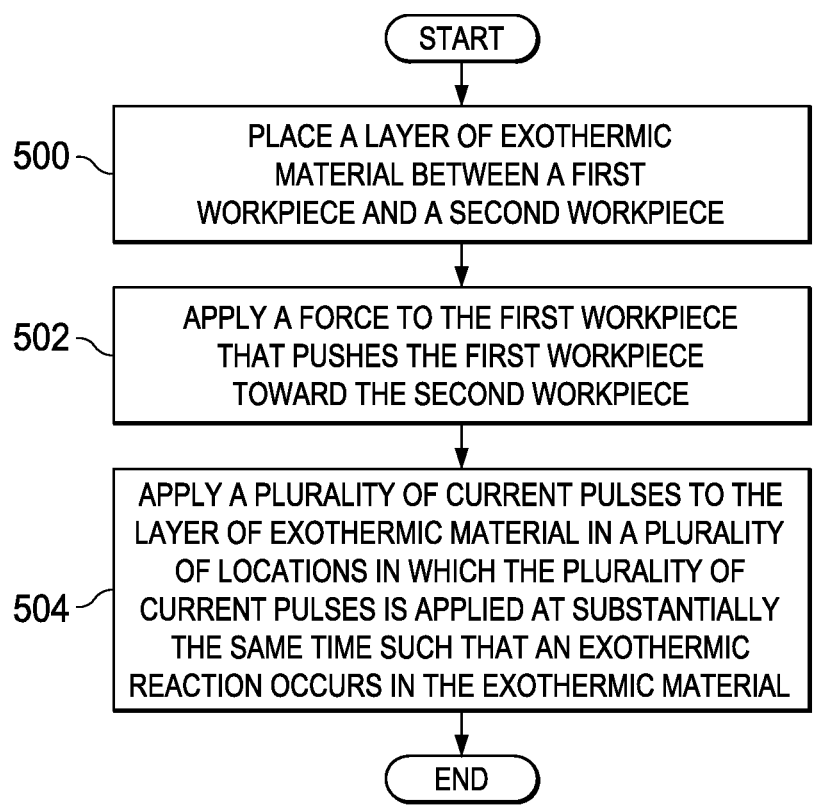
FIG. 5 is an illustration of a flowchart of a process for bonding workpieces to each other in accordance with an illustrative embodiment.

Turning now to FIG. 5, an illustration of a flowchart of a process for bonding workpieces to each other is depicted in accordance with an illustrative embodiment. The process illustrated in FIG. 5 may be implemented in manufacturing environment 400 in FIG. 4. In particular, the process may be implemented using bonding system 402 in FIG. 4.

The process begins by placing a layer of exothermic material between a first workpiece and a second workpiece (operation 500). A force is applied to the first workpiece that pushes the first workpiece toward the second workpiece (operation 502).

The process then applies a plurality of current pulses to the layer of exothermic material in a plurality of locations in which the plurality of current pulses is applied at substantially the same time such that an exothermic reaction occurs in the exothermic material (operation 504), with the process terminating thereafter.

The flowchart and block diagrams in the different depicted embodiments illustrate the architecture, functionality, and operation of some possible implementations of apparatuses and methods in an illustrative embodiment. In this regard, each block in the flowchart or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowchart or block diagrams.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Thus, one or more illustrative embodiments provide a method and apparatus for bonding workpieces to each other. The bonding may include forming a hermetic seal between the bonded workpieces. This type of seal may be desirable when a component sensitive to the environment is present in the interior of the workpieces bonded to each other. In these illustrative examples, this process may be performed at temperatures lower than other forms of bonding using solder. In these illustrative examples, the process may be performed at room temperature. The heat generated is from the exothermic reaction in the exothermic material instead of from an external source. Further, the process may also generate a hermetic seal between the components. This type of seal may be especially desirable when integrated circuits are located in an interior of a package formed using these operations.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for joining a first workpiece and a second workpiece to each other, the method comprising:

placing a layer of exothermic material between the first workpiece and the second workpiece, wherein the first workpiece is a cover and the second workpiece comprising a substrate, the cover covering an integrated circuit on the substrate, the substrate and cover forming a package for holding the integrated circuit; and applying a plurality of currents to the layer of exothermic material in a plurality of locations, wherein the plurality of currents is applied substantially simultaneous such that an exothermic reaction occurs in the layer of exothermic material.

2. The method of claim 1 further comprising:

applying a force to the first workpiece that pushes the first workpiece toward the second workpiece, wherein the force is applied while the exothermic reaction occurs.

3. The method of claim 1, wherein the exothermic reaction causes a formation of a hermetic seal between the first workpiece and the second workpiece.

4. The method of claim 1, wherein:

placing the layer of exothermic material comprises, placing a first layer of exothermic material between the first workpiece and the second workpiece, and further comprises placing a second layer of exothermic material between the second workpiece and a third workpiece, the third workpiece located between the first workpiece and the second workpiece; and applying the plurality of currents to the layer of exothermic material in the plurality of locations comprises applying a first number of the plurality of current pulses to the first layer of exothermic material at a first number of the plurality of locations and applying a second number of the plurality of current pulses to the second layer of exothermic material at a second number of the plurality of locations, wherein substantially simultaneous application of the first and second plurality of current pulses to the first and second layers of exothermic material causes the exothermic reaction to occur in the first layer of exothermic material and the second layer of exothermic material.

5. The method of claim 1, wherein the plurality of currents each have a same duration selected such that the exothermic reaction occurs in the layer of exothermic material in which the first workpiece and the second workpiece are joined to the each other by the layer of exothermic material.

6. The method of claim 1, wherein applying the plurality of currents to the layer of exothermic material, further comprises:
applying the plurality of currents to the layer of exothermic material at a room temperature, wherein the plurality of currents is applied substantially simultaneous, the plurality of currents having a duration selected such that the exothermic reaction occurs in the layer of exothermic material in which the first workpiece and the second workpiece are joined to the each other by the layer of exothermic material.

7. The method of claim 4, wherein applying the plurality of currents to the layer of exothermic material in the plurality of locations further comprises:
applying a first number of the plurality of current pulses to the first layer of exothermic material, the first layer of exothermic material including a first number of layers of solder producing a first exothermic reaction; and
applying a second number of the plurality of current pulses to the second layer of exothermic material, the second layer of exothermic material including a second number of layers of solder producing a second exothermic reaction.

8. The method of claim 1, wherein placing a layer of exothermic material between the first workpiece and the second workpiece, the first workpiece being a cover and the second workpiece comprising a substrate, further comprising:
employing only second workpieces including a printed circuit board, forming a printed circuit board substrate contained within the second workpiece.

9. The method of claim 1, wherein placing a layer of exothermic material between the first workpiece and the second workpiece, further comprises the layer of exothermic material having a plurality of layers of a first metal interleaved with a plurality of layers of a second metal.

10. The method of claim 1, wherein forming a package for holding the integrated circuit, further includes selecting the integrated circuit from one of the group consisting of mounted to, located on, bonded to, attached to, secured to, and sealed to, the substrate.

11. The method of claim 1, wherein forming a package for holding the integrated circuit, further includes forming the package for providing protection and electrical connections for the integrated circuit.

12. The method of claim 1 further comprising bonding the integrated circuit to the substrate by a bonding system, the bonding system bonding the integrated circuit to the substrate using a plurality of current pulses having a same amplitude and direction.

13. The method of claim 12, comprising selecting the amplitude of the plurality of current pulses based on at least one of the shape of the package, the shape of the cover, the type of the exothermic material, the type of the solder material, and the total surface contact area to be bonded.

14. The method of claim 13, wherein forming the package for holding the integrated circuit, further includes the package being made from one of the group consisting of ceramic, glass, and metal.

15. A method for sealing a circuit on a printed circuit board, the method comprising:
placing a layer of exothermic material between a cover and the printed circuit board, wherein the cover is located over an integrated circuit on the printed circuit board;
applying a plurality of current pulses to the layer of exothermic material in a plurality of locations, wherein the plurality of current pulses is applied substantially simultaneous such that an exothermic reaction occurs in the layer of exothermic material; and
applying a force that pushes the cover toward the printed circuit board while the exothermic reaction occurs, wherein a hermetic seal is formed between the cover and the printed circuit board.

16. The method of claim 15, wherein the layer of exothermic material is a two-ply layer having a first-ply and a second-ply, and placing the first-ply of exothermic material between the cover and the printed circuit board comprises:
placing the first-ply of exothermic material between the printed circuit board and a frame, and;
placing the second-ply of exothermic material between the frame and the cover, wherein locating the frame between the cover and the printed circuit board and applying the plurality of current pulses comprises:
applying the plurality of current pulses to the first-ply of exothermic material and the second-ply of exothermic material in the plurality of locations, wherein the plurality of current pulses is applied at substantially simultaneous such that the exothermic reaction occurs at substantially simultaneous in the first-ply of exothermic material and the second-ply of exothermic material.

17. The method of claim 15, wherein placing a layer of exothermic material between the cover and the printed circuit board, further comprises a plurality of layers of aluminum interleaved with a plurality of layers of nickel having a frame shape.

18. The method of claim 16, wherein locating the frame between the cover and the printed circuit board, includes the frame being one of a number of frames, and further comprises:
bonding each of the number of frames to at least one of the cover and the substrate; and
facilitating said bonding, wherein each frame comprises an amount of gold.

19. The method of claim 16, wherein locating the frame between the cover and the printed circuit board, further includes the frame being one of a number of frames, and wherein each of the number of frames comprises a shape from the group consisting of rectangular, square, circular, triangular, and hexagonal.

20. The method of claim 19, wherein locating the frame between the cover and the printed circuit board, further includes the frame being one of a number of frames, wherein each frame comprises a number of openings, the number of openings selected from the group consisting of zero openings, one opening, and multiple openings.

* * * * *